US010461965B1

(12) United States Patent
Contreras et al.

(10) Patent No.: US 10,461,965 B1
(45) Date of Patent: Oct. 29, 2019

(54) ACTIVE LOW-POWER TERMINATION

(71) Applicant: Western Digital Technologies, Inc., San Jose, CA (US)

(72) Inventors: John Thomas Contreras, Palo Alto, CA (US); Rehan Zakai, San Ramon, CA (US); Sayed Mobin, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/146,697

(22) Filed: Sep. 28, 2018

(51) Int. Cl.
| H04L 25/02 | (2006.01) |
| H03K 19/0185 | (2006.01) |
| H05K 1/11 | (2006.01) |
| H03F 3/30 | (2006.01) |
| H03F 3/45 | (2006.01) |
| G11C 5/06 | (2006.01) |

(52) U.S. Cl.
CPC ......... H04L 25/0298 (2013.01); H03F 3/301 (2013.01); H03F 3/45 (2013.01); H03K 19/018578 (2013.01); H04L 25/028 (2013.01); H04L 25/0278 (2013.01); H04L 25/0292 (2013.01); H05K 1/111 (2013.01); G11C 5/063 (2013.01); H05K 2201/10159 (2013.01)

(58) Field of Classification Search
None
See application file for complete search history.

(56) References Cited

U.S. PATENT DOCUMENTS

| 5,530,377 | A | 6/1996 | Walls |
| 6,331,787 | B1 | 12/2001 | Whitworth et al. |
| 6,388,495 | B1* | 5/2002 | Roy ................... G06F 13/4086 326/30 |
| 6,501,293 | B2 | 12/2002 | Braceras et al. |
| 6,937,111 | B2 | 8/2005 | Kwon |
| 7,068,064 | B1 | 6/2006 | Yen |
| 2002/0190747 | A1 | 12/2002 | Whitworth |
| 2005/0105318 | A1 | 5/2005 | Funaba et al. |
| 2015/0012759 | A1 | 1/2015 | Mozak et al. |

* cited by examiner

*Primary Examiner* — Jany Richardson
(74) *Attorney, Agent, or Firm* — Vierra Magen Marcus LLP

(57) ABSTRACT

An active low-power termination circuit includes a first leg of a pair of transistors connected in series between the high supply level and ground, where the termination input is at a node between the transistors of the first node. A second leg uses a feed forward mechanism to control the voltage levels on the control gates of the transistors of the first leg. The second leg includes a second pair diode connected transistors, each of which is has its control gate connected to the control gate of the corresponding transistor in the first leg. A variable current source connected in series with the transistors of the second leg and is controlled by the output of a difference amplifier that has one input connect to an intermediate node of the second leg and a second input connected to a reference level intermediate to the high supply level and ground.

20 Claims, 11 Drawing Sheets

ACTIVE LOW-POWER TERMINATION

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory devices are often formed of a SiP (System in a Package) device including a number of memory die mounted in an offset stack on a substrate. The semiconductor die may be electrically coupled to each other and the substrate using wire bonds affixed to each die, cascading down the die stack. There is an increasing requirement for high performance with low power. Wire-bond and other electronic packages have inherent parasitic capacitance. Although the parasitic capacitances have been decreasing, this decrease does not keep up with the growing bandwidth requirements for faster data throughput. Today, this bandwidth restriction is limited by the parasitic capacitances. A typical solution is to reverts to using lower impedance receiver termination, but this lower termination increases power consumption when using passive resistive termination. Wire-bond and other electronic packages solution could benefit from is needed to use lower receiver termination while not significantly increasing the power.

BRIEF DESCRIPTION OF THE DRAWINGS

Like-numbered elements refer to common components in the different figures.

DETAILED DESCRIPTION

The present technology will now be described with reference to the figures, which in embodiments, relate to a termination circuit for a transmission line, such the bond wires used to connect the memory die of a memory device or other integrated circuits that use such interconnects to exchange signals. As discussed above in the Background, a lower resistive termination increases the power used. The following discusses the use of CMOS active devices to create a digital signal's termination. The active circuit uses multi-modes of impedances while transitioning from a logic Low to a logic High and from switching from a logic High to a logic Low. The three main modes are to have a higher receiver impedance in a Low or High, but during a logic transition (L to H or H to L), the receiver impedance would be a low impedance for both bandwidth improvements and transmission line termination. In some embodiments, the impedance value can be programmable through calibration steps, along with temperature compensation. This new low-power termination architecture is an active low-power termination (ALPT).

In certain embodiments, the active termination circuit includes a first leg of a pair of transistors connected in series between the high voltage supply level and ground, where the termination input is at a node between the transistors of the first node. A second leg uses a feed forward mechanism to control the voltage levels on the control gates of the transistors of the first leg. The second leg includes a second pair of series connected transistors, each of which is diode connected and has its control gate connected to the control gate of the corresponding transistor in the first leg. The second leg also includes a variable current source connected in series with the transistors of the second leg. The variable current source is controlled by the output of a difference amplifier that has one input connect to an intermediate node of the second leg and a second input connected to a reference level that is intermediate to the high supply level and ground. The active termination circuit is suitable for termination use with bond wires carrying digital signals of relatively high voltage levels (i.e., on the order of 1 volt or more) between integrated circuits.

Figure 1:
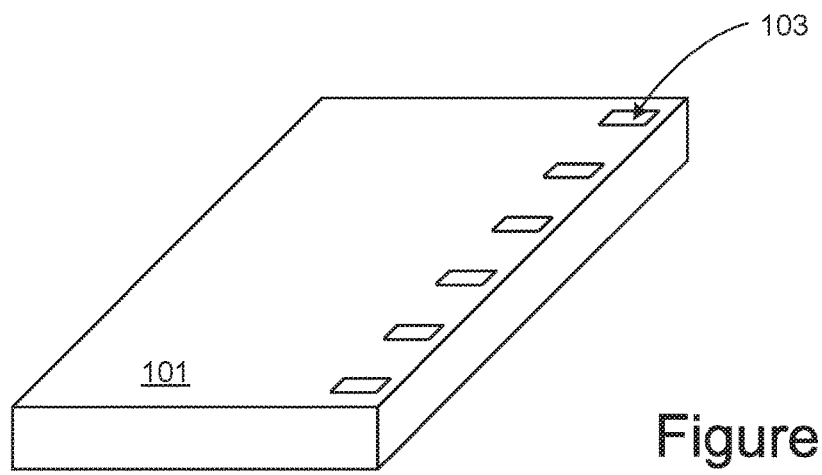
FIG. 1 is a schematic representation of an integrated circuit or semiconductor die that includes a number of die bond pads.

FIG. 1 is a schematic representation of an integrated circuit or semiconductor die 101 that includes a number of die bond pads 103 by which the integrated circuit 101 can be connected by a transmission line, or bond wire, to other elements, such as other integrated circuits or a printed circuit board. The integrated circuit 101 may for example be memory die such as 2D NAND flash memory or 3D BiCS (Bit Cost Scaling), V-NAND or other 3D flash memory, but other types of die 101 may be used. These other types of semiconductor die include but are not limited to controller die such as an ASIC, or RAM such as an SDRAM, DDR SDRAM, LPDDR and GDDR.

The semiconductor die 101 may include a number of die bond pads 103 along an edge of the semiconductor die. A number of die can be combined into a package, with each die bond pad can be referred to herein as a channel, with a first die bond pad on each die arbitrarily referred to as the first channel, a second die bond pad on each die arbitrarily referred to herein as the second channel, and so on for the remainder of the die bond pads 103 on the semiconductor die 101. In embodiments explained below, each of the first channel die bond pads on all the die of a package may be connected to each other and a printed circuit board (PCB) or other substrate, each of the second channel die bond pads on all die may be connected to each other and the substrate, and so on across the die bond pads 103 of a die 101.

Figure 2:
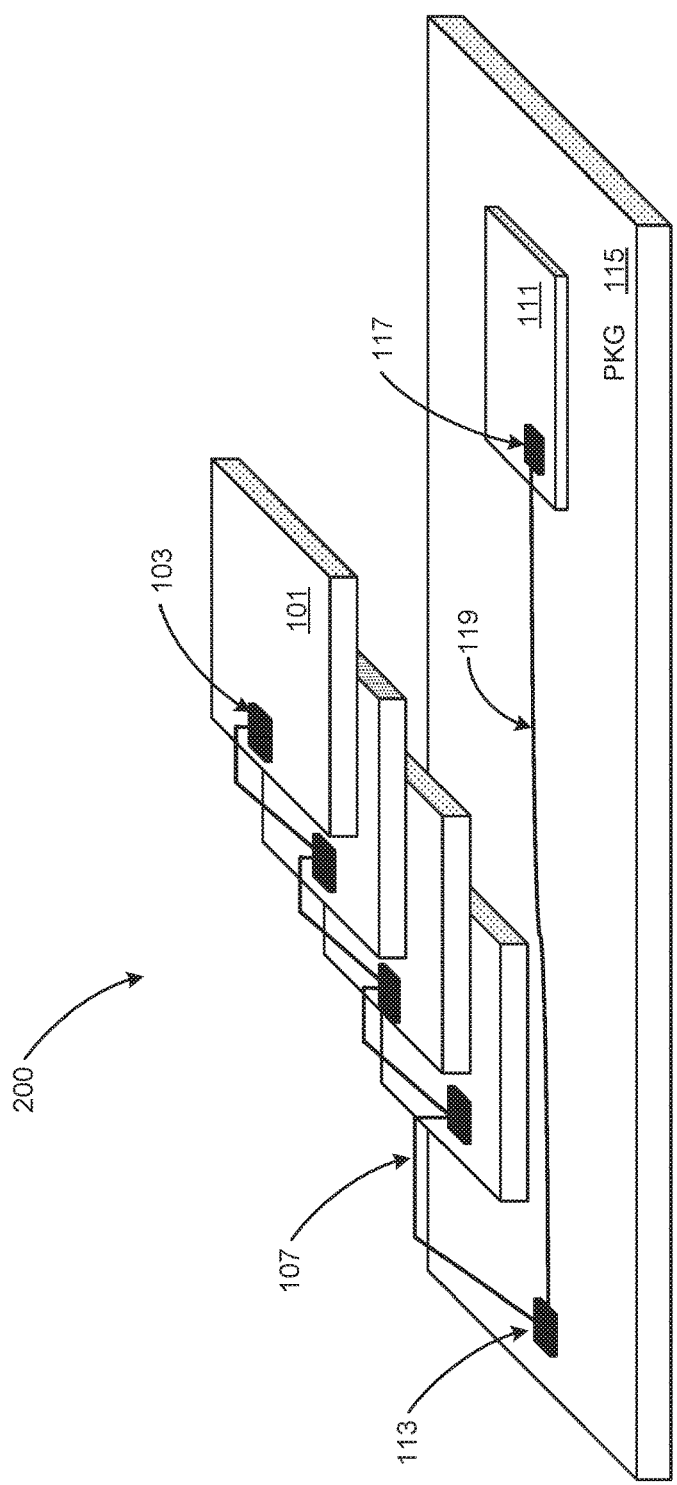
FIG. 2 is a schematic representation of a memory package of four memory die with an on-board memory controller.
Figure 3:
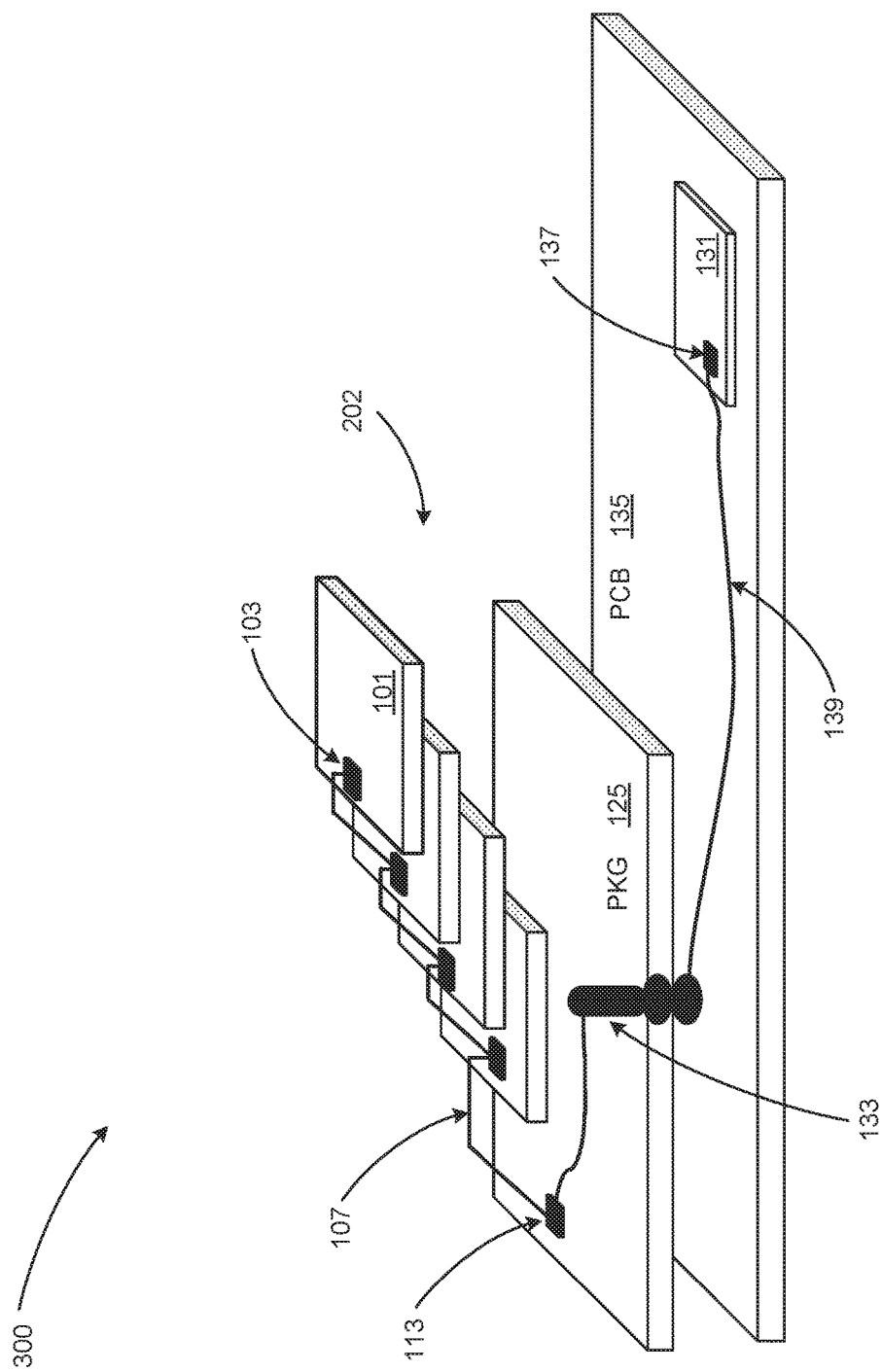
FIG. 3 is a schematic representation of a memory package attached on a printed circuit board with an external memory controller.

FIGS. 2 and 3 illustrate embodiments of a number of memory die combined into a package, where the die bond pads of the die in the package are connected by a set of wire bonds severing the transmission lines between the memory integrated circuit. Together the memory die of one more or packages can be combined with a memory controller into a memory system, with the wire bonding interconnecting these elements serving as the system bus.

FIG. 2 is a schematic representation of a memory package 200 of four memory die 101, such as a 3D NAND memory structure, on a package board PKG 115. The memory die 101 are stacked one on another, offset somewhat to expose the bond pads 103 along the edge of the memory die 101 so that these pads can be connected wire bonds 107. To simplify the figure, only a single bond pad 103 connected by a single wire bond 107 channel is shown for each memory die 101, but where actually embodiment would have several (e.g. 8) such bus lines or channels that would form a system bus.

The stack of the memory die 101 are attached to the package board PKG 115 which includes a bond pad 113. In the embodiment of FIG. 2, the memory package 200 includes an on-board memory controller 111 ASIC. The memory controller 111 includes a set of bond pads, one of which is shown at 117, that is also connected to the board's bond pad 113 along a transmission line 119 of, for example, around 5 mm in length in a typical arrangement. The package 200 of FIG. 2 could, for example, be a memory card or one of a number of packages forming a solid state drive (SSD).

FIG. 3 is a schematic representation of an embodiment for a memory system 300 in which a package 202 of a number of memory die 101 does not include an on-board controller, but where one or more such packages are attached to a printed circuit board PCB 135 that includes an external memory controller 131 ASIC that is connected to the one or more memory package 202. The memory package 202 is formed similarly to package 200 of FIG. 2, but does not include an on-board controller on the package board PKG 125. The wire bonds 107 are again connected to an bond pad 113 on the package board PKG 125, but instead of connecting an on-board controller ASIC, a transmission line 139, typically around 50 to 100 mm long, on PKG 125 is connected to a via 133 or other connection to a transmission line 139 formed on PCB 135 that connects to the bond pad 137 of controller 131. The controller 131 is an external controller in that it is not formed as part of the memory package 202, but is rather on the PCB 135. Although only a single memory package 202 is shown in FIG. 3, the memory system may include a number of such memory packages 202 connected to a single PCB 135. A PCB 135 with one or more memory packages attached can be part of a solid state drive (SSD), for example, that may include many such PCBs as sub-components. Other additional integrated circuits and other elements may be incorporated into the package 200, package 202, included on the PCB 135, or both.

The wire bonds or transmission lines connecting the different integrated circuits (101, 111, 131), the package board (115, 125) and the PCB 135 end or terminate on a bond pad. Electrical termination is the practice of ending a transmission line with a device that matches the characteristic impedance of the line, whether for the wire bonds or transmission lines 107 or transmission lines connecting other integrated circuits or electrical components. The termination is intended to prevent signals from reflecting off the end of the transmission line. Reflections at the ends of unterminated transmission lines can cause distortion that can produce ambiguous digital signal levels and mis-operation of digital systems. Reflections in analog signal systems cause such effects as video ghosting, power loss in radio transmitter transmission lines, or data logic signal errors.

Signal termination often requires the inclusion of a termination circuit at the beginning and/or end of a wire or cable to prevent a signal from being reflected back from each end, causing interference, or power loss. Depending on the embodiment, the termination can be placed at the end of a transmission line or on the various elements connected along the system bus and is designed to match the AC impedance of the cable and hence minimize signal reflections and power losses. In some embodiments, a termination circuit can also be placed at the driving end of the wire or cable.

For example, in the embodiments represented in FIGS. 2 and 3, each of the memory die 101 can include termination, or only the end most memory die (the top memory die 101 of the stack as represented in either of FIG. 2 or 3). As all of the memory die will often be of the same design, a termination circuit can be included for each of the bonding pads of all the memory die. In some embodiments, the termination circuit will be active on a memory die when the memory die is active. In other embodiments, only the termination on the end most memory die along the system bus will provide termination for whichever of the memory die are active, with the other memory die's termination circuits not being active.

For many systems, the termination is a passive resistive termination using resistors or a combination of MOSFET switches for programmability, with a value programmed to match the characteristic impedance of the transmission line, and chosen to have acceptably low parasitic inductance and capacitance at the frequencies relevant to the system. Depending on the application, the signal on the line being terminated can be an analog signal or a digital signal. In many integrated circuit applications, the analog signals being terminated will often be on the order of tens or hundreds of millivolts. For the primary embodiments begin discussed here, such as a bus structure on a non-volatile memory system, the main application will be to digital signals having a relatively large voltage level spread between the low and high logic levels, such as ~1.5V or, more generally in the range of 1V to 5V or even higher.

Figure 4:
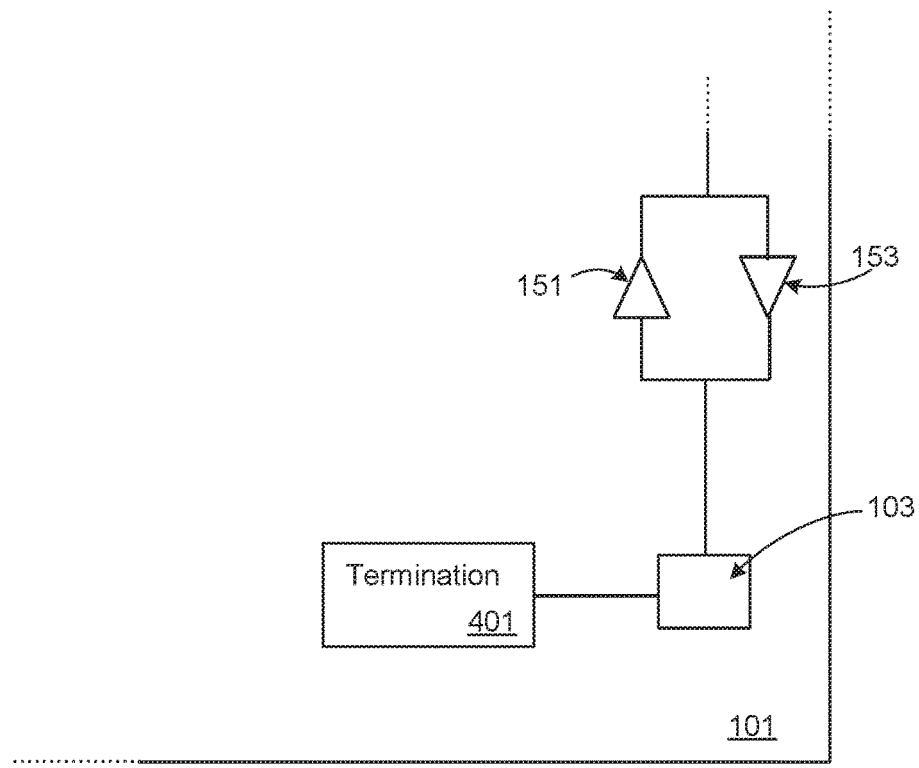
FIG. 4 looks at the inclusion of a termination circuit on an integrated circuit.

FIG. 4 looks at the inclusion of a termination circuit on an integrated circuit, such as a non-volatile memory circuit 101. As noted above, although the following discussion in given primarily in terms of the integrated circuits of a non-volatile memory system, the techniques readily apply more generally. More specifically, FIG. 4 shows an edge of a memory die integrated circuit 101 and one of its die bond pads 103. The die bond pad 103 is connected to an input driver 151, configured to supply signals received on the bond pad on to other internal elements of the integrated circuit, and an output driver 153, configured to supply signals from the integrated circuit's other internal elements to the bond pad 103 and on to the bond wire attached to the bond pad. Also attached to the bond pad 103 is a termination circuit 401.

Figure 5:
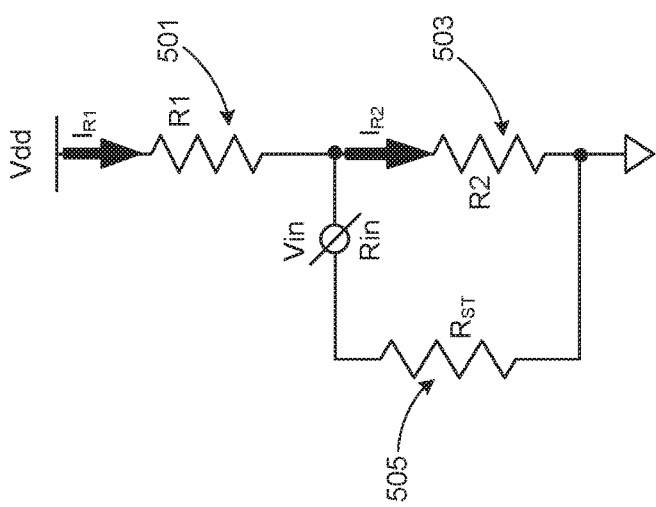
FIG. 5 illustrates an example of a passive termination circuit.

FIG. 5 illustrates an example of passive termination. The termination circuit is formed of a first resistor R1 501, connected between the high voltage supply level of Vdd and an input node, and a second resistor R2 503 connected between the input node and the low voltage supply level, taken here as ground. To provide an input resistance of Rin as seen at the input node, the value of the resistances R1 501 and R2 503 are each taken as 2Rin. The resistors R1 501 and R2 503 can be implemented as resistors or MOSFETs configured as resistances, for example. The resistance of the attached transmission line is represented as $R_{ST}$ 505, where in the example of the memory packages of FIG. 2 or 3, this would correspond to the cumulative resistance of a bond wire along the length of the stack of die (or "stack resistance"). FIG. 5 illustrates the connection of $R_{ST}$ corresponding to a low logic state of ground. In FIG. 5, as well as in subsequent FIGS. 7, 8A-C, and 10, the transmission line (119 of FIG. 2, 139 of FIG. 3) between the $R_{ST}$ source controller impedance and the Vin node is not shown.

In such a passive termination circuit, low impedance Rin increases the bandwidth, $1/(2\pi \text{RinC})$, where C is the parasitic capacitance of the signal input or the distributed inputs of a stacked-die. However, using low-resistance passive termination consumes high power, as the resistors R1 501 and R2 503 are in a series connection between the high power supply voltage (Vdd) and ground, so that lowering the value of Rin increases the current flowing in the termination circuit and power consumption of the memory die. This can be illustrated with respect to FIGS. 6A-6C.

Figure 6A:
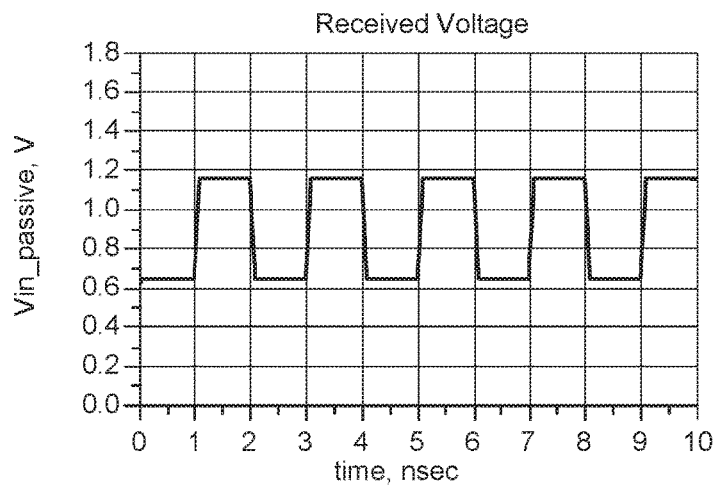
FIG. 6A is a plot of a voltage applied at the input of the passive termination circuit of FIG. 5 and FIGS. 6B and 6C illustrate the current though elements of FIG. 5 in response to the applied voltage of FIG. 6A.
Figure 6B:
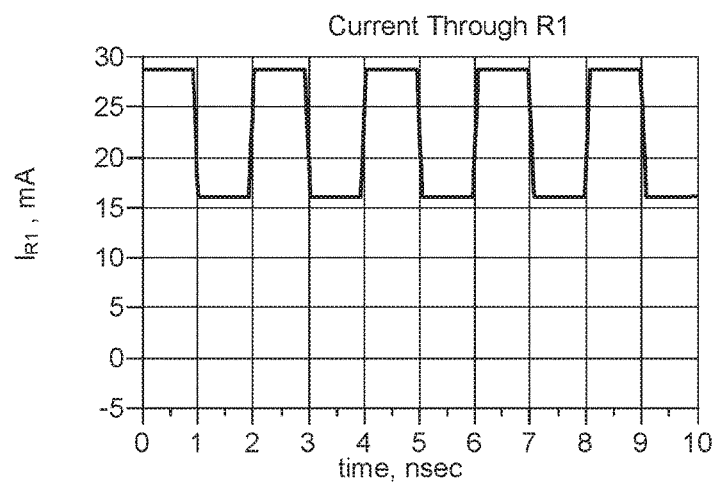
Figure 6C:
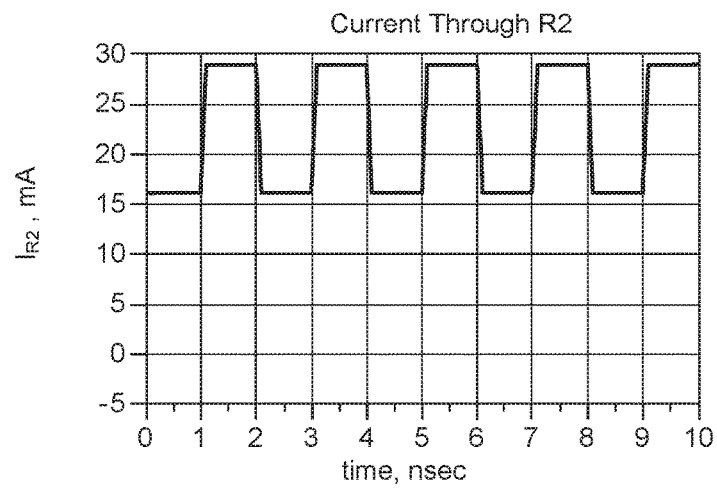

FIG. 6A is a plot of a voltage Vin_passive applied at the input of the passive termination circuit of FIG. 5 as a function of time. In this example, the input voltage alternates between a high value around 1.2V and a low value of a little over 0.6V, with a period of about 2 ns. FIGS. 6B and 6C respectively illustrate the corresponding currents $I_{R1}$ through R1 501 and $I_{R2}$ through R2 503 in response to the input waveform of FIG. 6A. As illustrated in FIG. 6B, when the received input Vin_passive is high, the voltage at the node below R1 501 is high, and $I_{R1}$ is low; and when the received input Vin_passive is low, the voltage at the node below R1 501 is low, and $I_{R1}$ is high. As illustrated in FIG. 6C, when the received input Vin_passive is high, the voltage at the node above R2 503 is high, and $I_{R2}$ is high; and when the received input Vin_passive is low, the voltage at the node above R2 503 is low, and $I_{R2}$ is low. Consequently, $I_{R1}$ is half a cycle out of phase with Vin_passive and $I_{R2}$ is in phase. In both cases, though, the low value of $I_{R1}$ and $I_{R2}$ are both non-zero, so that there is constantly current flowing through both of R1 501 and R2 503. The graphs of FIGS. 6A-6C are based on a particular set of values for the period, resistance, and supply levels, so that the graphs will vary according to different implementation values, but are illustrative of the general behavior.

To provide a low impedance receiver termination at a lower power than resistive termination, the following presents embodiments of a low-power termination architecture that is an active low-power termination (ALPT). As described below, the ALPT architecture system is characterized by lower power/current consumption than resistive termination. It can also include a programmable termination impedance.

Figure 7:
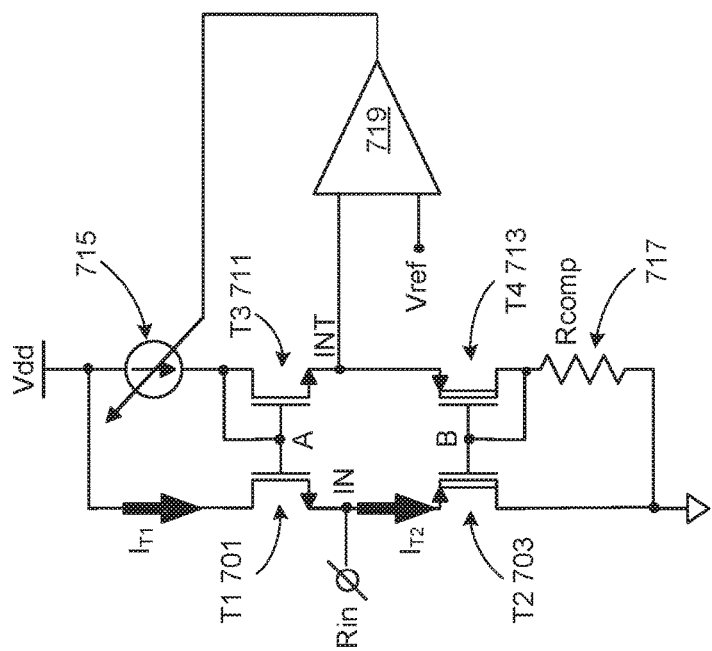
FIG. 7 illustrates an embodiment for an active low-power termination circuit.
Figure 10:
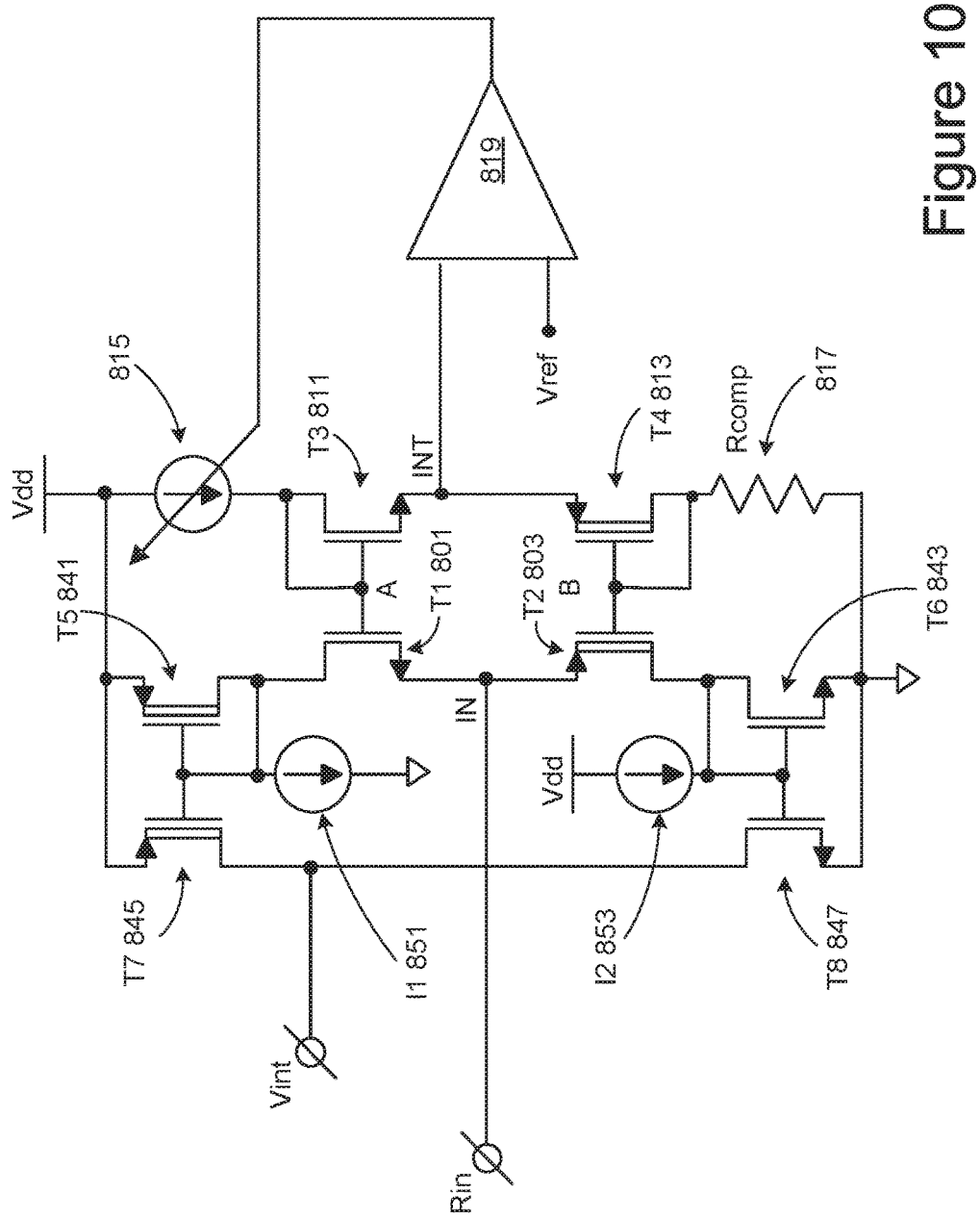
FIG. 10 illustrates another embodiment for an active low-power termination circuit.

FIG. 7 illustrates a first embodiment for an active low-power termination circuit. Rather than the input of the termination circuit being received between a pair of series connected passive resistors as in FIG. 5, in an active termination it is received between a pair of active elements. In FIG. 7, the input for the termination is received at a node IN between a transistor T1 701, connected between Vdd and the input node, and a transistor T2 703, connected between the input node and ground. The transistors T1 701 and T2 703 of this first leg are controlled by a second leg with transistors T3 711 and T4 713. In the embodiment illustrated in FIG. 7, the transistors T1 701 and T3 711 are implemented as NMOSs and the transistors T2 703 and T4 713 are implemented as PMOSs. Although the active low-power termination (ALPT) described here, such as the embodiments illustrated with respect to FIGS. 7 and 10, are mainly described with respect to use on the integrated circuits of a non-volatile memory system, the techniques are applicable to other bus lines requiring low power and lower impedance for higher bandwidth.

In the second leg, T3 711 is connected between Vdd and intermediate node INT and T4 713 is connected between the intermediate node INT and, through a resistor Rcomp 717, ground. The resistance Rcomp 717 can be implemented as a resistor or a MOSFET configured as a resistance, for example. A difference amplifier 719 has a first input connected to the INT node and a second input connected to a reference value Vref, where the value of Vref will typically be Vdd/2, but more generally will be a voltage level intermediate to the high voltage supply (Vdd) and low voltage supply (ground) levels. The inclusion of Rcomp 717 can be important as it allows for the decoupling of the power consumed by the circuit form the value of Vref, as without Rcomp 717 power will increase with increasing Vref. The output of the difference amplifier 719 is connected to control a variable current source 715, such as a transistor, that is connected in series with T3 711 and T4 713 in the second leg, here being between the Vdd input to the second leg and T3 711.

Both of transistors T3 711 and T4 713 are diode connected, with the control gate of T3 711 connected between T3 711 and the variable current source 715 and the control gate of T4 713 connected between T4 713 and Rcomp 717. The voltage level at the intermediate node INT will vary with the current flowing from the variable current source 715. As the current source is controlled by the difference amplifier 719, whose first input is connected to the voltage at the intermediate node INT and whose second input is at Vref, the difference amplifier will adjust the current level from source 715 to set the node INT at Vref. Although other values for can be used for Vref, for the remainder of the discussion Vref will be taken as Vref=Vdd/2. To account for temperature variations, a reference current proportional to absolute temperature (PTAT) can also be incorporated.

In the first leg of the termination circuit, the gate of transistor T1 701 is connected to the node A, which is also connected to the gate of T3 711, so that the level on the gate of T1 701 mirrors the level on the gate of T3 711. Similarly, the gate of transistor T2 703 is connected to the node B, which is also connected to the gate of T4 713, so that the level on the gate of T2 703 mirrors the level on the gate of T4 713. This results in the input node IN begin driven to be at the same voltage as the intermediate node INT of the second leg, Vdd/2. Consequently, the second leg of the termination circuit of FIG. 7 provides a feed forward mechanism, with the difference amplifier 719 setting the level on the input node IN based on the intermediate reference voltage level Vdd/2 (as opposed to a feedback mechanism where the level would be varied based on the voltage received from a transmission line connected the input node IN.) This helps to provide a termination function that has a number of advantages when terminating lines carrying digital signals, as described further below with respect to FIGS. 8A-C, 9A-C, and 11.

When an integrated circuit has a number of die bond pads each needing a termination circuit, the second leg of FIG. 7 can be shared among multiple first legs, with each pad having its own first leg of transistors T1 701 and T2 703 whose control gates would be respectively connected at node A and node B. In this way, each of the first legs for the different die bond pads would have their transistors biased by the common second leg. This arrangement can further reduce the amount of power consumed.

The termination circuit of FIG. 7 is a "bolt-on" embodiment of an active termination circuit, in that in can be incorporating to provide termination in already existing circuit design as it is designed to work with existing logic inputs and outputs. This allows for use of a predefined logic mask (i.e., acceptance of the existing voltage range). The design of FIG. 7 also has the advantage of only requiring only node attachment. As described further below with respect to FIGS. 8A-C and 9A-C, it can draw less power than a passive termination circuit and, as described further below, can be tuned and calibrated so that the circuit's CMOS sizes will be balanced to match the different logic states and process.

The first leg of the termination circuit of FIG. 7, where transistors T1 701 and T2 703 are connected is series between Vdd and ground, acts as a push-pull circuit with respect to the input node IN. Push-pull circuits are typically used for amplifier outputs. In bipolar designs, a push-pull circuit is an emitter follower. In a CMOS design, as in FIG. 7, the push-pull circuit is a source follower. In a source follower circuit, the source follower's impedance level is determined by the transconductance of the transistors. The transconductance for a source follower is determined by the device size and current, along with other CMOS technology parameters (e.g. the oxide thickness, Tox) that also contribute to determining the transconductance. As discussed below after the discussion of FIG. 10, the termination circuits of FIGS. 7 and 10 can calibrated to adjust the effective device sizes to account for variations in processing and the designed impedance of the transmission lines.

The termination circuit of FIG. 7 utilizes the push-pull configuration of its first leg as an input. For use in a memory system in which the wire bonds are used as a bus structure for the memory die 101 and controller 111 or 131, as illustrated in FIG. 2 or 3, the signals being terminated will be digital signals having either a low logic value (e.g., ground), a high logic value (e.g., Vdd), or which are in a transitional stage between the two. The logic low, transition, and high will create different operating conditions and are respectively illustrated with respect to FIGS. 8A, 8B, and 8C.

Figure 8C:
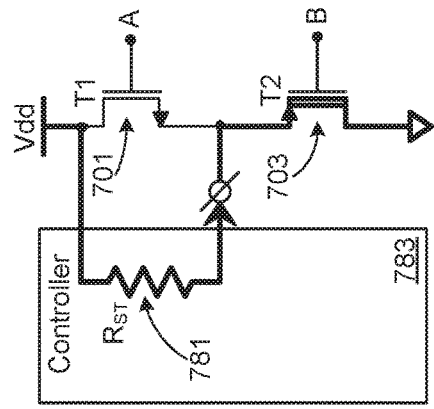
FIGS. 8A, 8B, and 8C respectively illustrate the behavior FIG. 7 for low logic, transition, and high logic input levels.
Figure 8B:
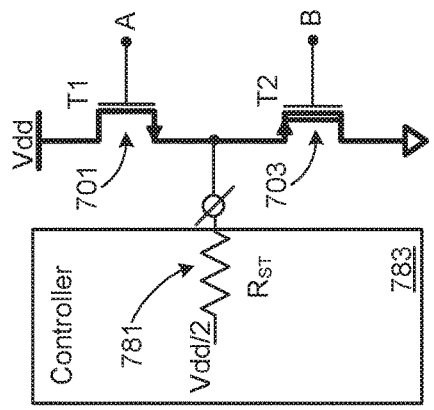
Figure 8A:
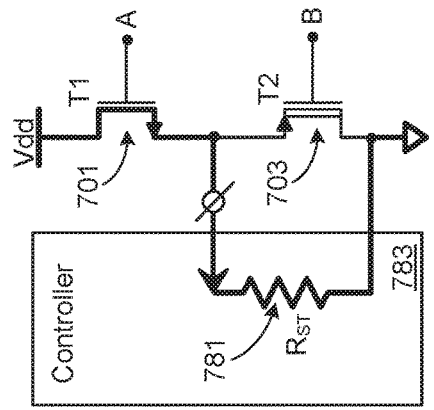

In each of FIGS. 8A, 8B, and 8C, only the input push-pull elements of T1 701 and T2 703 are shown from the termination circuit of FIG. 7, with the other elements from the second leg connected at nodes A and B as shown in FIG. 7, but not shown in FIGS. 8A, 8B, and 8C to simplify the drawings. The input node IN of the push-pull elements is connected the transmission line, such as a bond wire of one line or channel of a bus structure connecting a termination circuit on a memory die to a controller 783. The source termination impedance of the controller is represented as the resistance $R_{ST}$ 781.

FIG. 8A looks at when the signal from the controller 783 is at a logic low value of ground. In this situation, the input node IN of the termination circuit is consequently connected to ground though $R_{ST}$ 781. The current in the first leg of the termination circuit will mainly come from Vdd through T1 701, as illustrated by the heavier line weight in the figure, and T2 703 will be largely non-conductive.

FIG. 8B looks at when the signal from the controller 783 during a logic transition, either form low to high or high to low. In this situation, the voltage level applied to the line is passing through the intermediate value of Vdd/2. The input node IN of the termination circuit is consequently connected though $R_{ST}$ 781 to levels passing though Vdd/2. In this situation, the voltage level from the input line being terminated will be at or near the voltage level on the node IN. Current in the first leg of the termination circuit will flow through both of T1 701 and T2 703, as again illustrated by the heavier line weight in FIG. 8B.

FIG. 8C looks at when the signal from the controller 783 is at a logic high value of Vdd. In this situation, the input node IN of the termination circuit is consequently connected to Vdd though $R_{ST}$ 781. The current in the first leg of the termination circuit will mainly flow to ground from Vdd through T2 703, as illustrated by the heavier line weight in the figure, and T1 701 will be largely non-conductive.

Figure 9A:
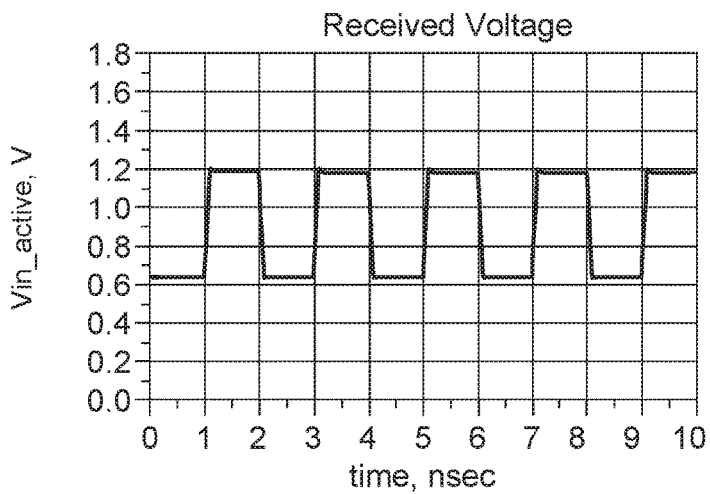
FIG. 9A is a plot of a voltage applied at the input of the active termination circuit of FIG. 7 and FIGS. 9B and 9C illustrate the current though elements of FIG. 7 in response to the applied voltage of FIG. 9A.
Figure 9B:
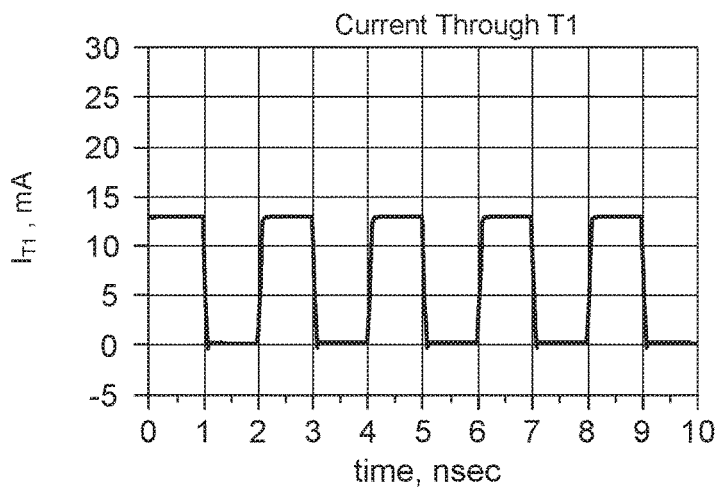
Figure 9C:
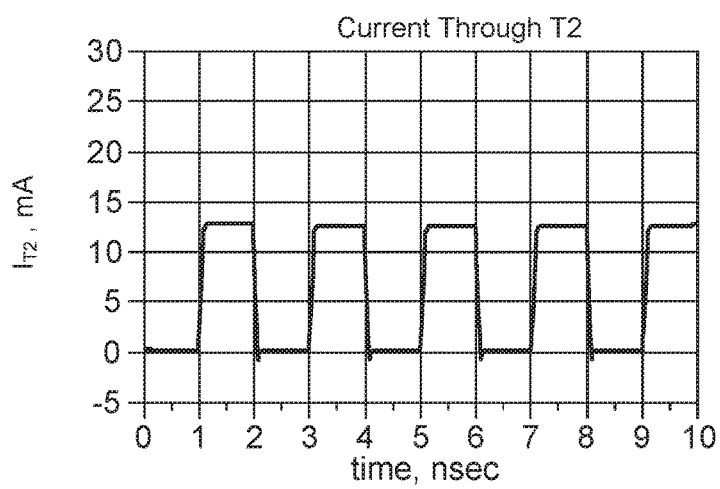

FIGS. 9A, 9B, and 9C respectively illustrate voltage applied at the input terminal IN in FIG. 7, and the current flowing in T1 701 and T2 703 in response. As such, FIGS. 9A, 9B, and 9C are the active low-power termination counterparts of FIGS. 6A, 6B, and 6C for the passive termination of FIG. 5. More specifically, FIG. 9A is a plot of a voltage Vin_active applied at the input of the active termination circuit of FIG. 7 as a function of time. In this example, as in FIG. 6A, the input voltage alternates between a high value around 1.2V (corresponding to FIG. 8C), and a low value of a little over 0.6V (corresponding to FIG. 8A), with a period of about a 2 ns. FIGS. 9B and 9C respectively illustrate the corresponding currents $I_{T1}$ through T1 701 and T2 703 in response to the input waveform of FIG. 9A.

As illustrated in FIG. 9B, when the received input Vin_acitve is high (corresponding to a high logic state as in FIG. 8C), the voltage at the IN node is high, the current path is through T2 703 to ground, and $I_{T1}$ is low; and when the received input Vin_passive is low (corresponding to a low logic state as in FIG. 8A), the voltage at the IN node is low, the current path is from Vdd though T1 701 to $R_{ST}$ 781 and ground, and $I_{T1}$ is high. As illustrated in FIG. 9C, when the received input Vin_acitve is high, the voltage at the IN node is high, T2 703 is on, and $I_{T2}$ is high; and when the received input Vin_passive is low, the voltage at the IN node is low, T2 is off, and $I_{T2}$ is low. Consequently, $I_{T1}$ is half a cycle out of phase with Vin_active and $I_{R2}$ is in phase, similar to the $I_{R1}$ and $I_{R2}$ behavior of FIGS. 6B and 6C. Unlike the passive termination of case illustrated FIGS. 6B and 6C, however, the low current levels for both of $I_{T1}$ and $I_{T2}$ are at or near zero, with the high values moved down a corresponding amount as well. As can be seen by comparing FIGS. 6B and 6C with FIGS. 9B and 9C, the combined currents of $I_{T1}$ and $I_{T2}$ are reduced to about a ⅓ of the combined currents of $I_{R1}$ and $I_{R2}$, resulting in a significant saving of power. As with FIGS. 6A-6C, the graphs of FIGS. 6A-6C are based on a particular set of values for the period, resistance, and supply levels, so that the graphs will vary according to different implementation values; however, both sets of figures are based on the same set of assumptions and are comparable for illustration of relative power savings.

FIG. 10 illustrates an alternate embodiment for active low-power termination as part of an integrated active termination arrangement. The embodiment of FIG. 10 allows lower input impedance and is not restricted to a circuit's existing logic mask. The active termination circuit itself can generate a voltage level used to connect to internal logic circuits for the logic high and logic low states used on the transmission line. Relative to the embodiment of FIG. 7, the embodiment of FIG. 10 may require more overhaul of circuitry due to the change in logic level values.

The embodiment of FIG. 10 repeats the elements of FIG. 7, with similar elements being similarly number (e.g., T1 is now 801, rather than 701; T2 is now 803, rather than 703; and so on), but includes a number of additional elements. More specifically, T1 801 is now connected to Vdd through diode connected transistor T5 841. Similarly, T2 803 is connected to ground through diode connected transistor T6 843. In embodiment of FIG. 10, T5 841 is implemented as a PMOS whose gate is connected between T5 841 and T1 801, and T6 is implemented as an NMOS whose gate is connected between T2 803 and T6 843.

Also connected in parallel with the first and second legs of FIG. 10 is an additional leg configured to supply an internal logic level voltage Vint. The Vint level is supplied from a node connect to Vdd though a transistor T7 845 and to ground through a transistor T8 845. The control gate of T7 845 is connected to the control gate of T5 841 in a mirror arrangement and the control gate of T8 is connected to the control gate of T6 843, also in a mirror arrangement. A pair of low-power pre-bias trickle currents I1 851 and I2 853, respectively connected to the gates of T5 841 and T7 845 and to the gates of T6 843 and T8 846, can be included for faster turn on. The Vint voltage level is generated at the node between T7 845 and T8 847 by the active low-power termination circuit of FIG. 10 itself and can be used to connect to the internal logic circuits for the logic high and low logic states used on the signal lines that the circuit of FIG. 10 sill terminate. The Vint logic state is opposite of logic to the input state (i.e., Vint is high when the logic state is low and vice versa), but a simple logic inverter circuit can be used to switch back to the input logic level.

Relative to the embodiment of FIG. 7, the embodiment of FIG. 10 can consume even lower power, as the voltage swing associated with logic levels and corresponding current levels can be lower. This arrangement also allows for lower input impendence, with leads to a higher possible bandwidth. The introduction of the internal logic level of Vint may, however, require additional overhaul of the integrated circuit that incorporates the termination circuit.

Figure 11:
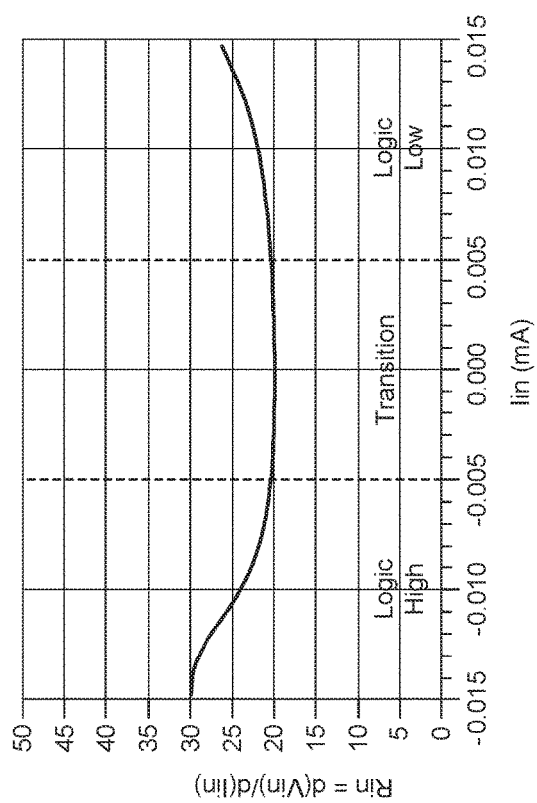
FIG. 11 illustrates a desired behavior of the resistance of the input node as a function of the current input current for the active termination circuit of FIG. 7.

FIG. 11 illustrates a desired behavior of the resistance Rin of the IN node as a function of the current Iin at the IN node for the active termination circuit of FIG. 7, where the circuit of FIG. 10 will behave similarly. The values of Rin and Iin in are related as Rin=d(Vin)/d(Iin). The plot of FIG. 11 has three regions, corresponding to logic low for Iin>0.005 mV, logic high for Iin<−0.005 mV, and the transition region in between. In a digital signal, when the signal is at either of the high or low logic states, the signal is at a steady value and it is not as important that Rin matches the impedance of the transmission line being connecting to the controller source termination (i.e., $R_{ST}$ in FIGS. 8A-8C); however, during transition it is important that Rin well-matches the line resistance to improve bandwidth. This is illustrated in FIG. 11 where the Rin curve is flat across the central logic state transition range, but curves upwards in the logic low and logic high regions. This is different than the situation for use with an analog signal, where the Rin value is preferable flat across the full signal range. To account for process variation in forming the termination circuit and to set Rin at a target value, the termination circuit can be trimmed.

Figure 12:
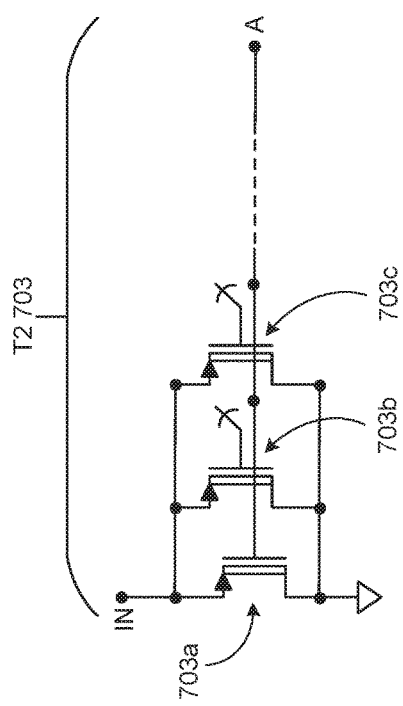
FIG. 12 illustrates using multiple devices to vary the effective width of a device in the embodiment of FIG. 7.

The active termination circuit of FIG. 7 can be calibrated by trimming the values of one or more of T1 701, T2 703, and Rcomp 717. For example, the effective width of the PMOS T2 703 can be varied by selectively connecting a number of PMOS transistors in parallel. This illustrated in FIG. 12 where T2 703 is implemented as multiple devices 703a, 703b, 703c, . . . connectable in parallel between the IN node and ground, with switches at the gate for the parallel devices and direct connections for the source and drain. The effective width of T2 703 is the combined width of the ones of 703a, 703b, 703c, . . . whose gates are connected to the node A. In calibration process, the effective width of T2 703 is set by which of 703a, 703b, 703c, . . . have their gates connected to the node A and which of 703a, 703b, 703c, . . . have their gate left unconnected. A similar arrangement can be used to calibrate the effective width of NMOS T1 701. A similar alternate location for the switch for the parallel devices would be located at the drain with direct connections for the source and gates.

Figure 13:
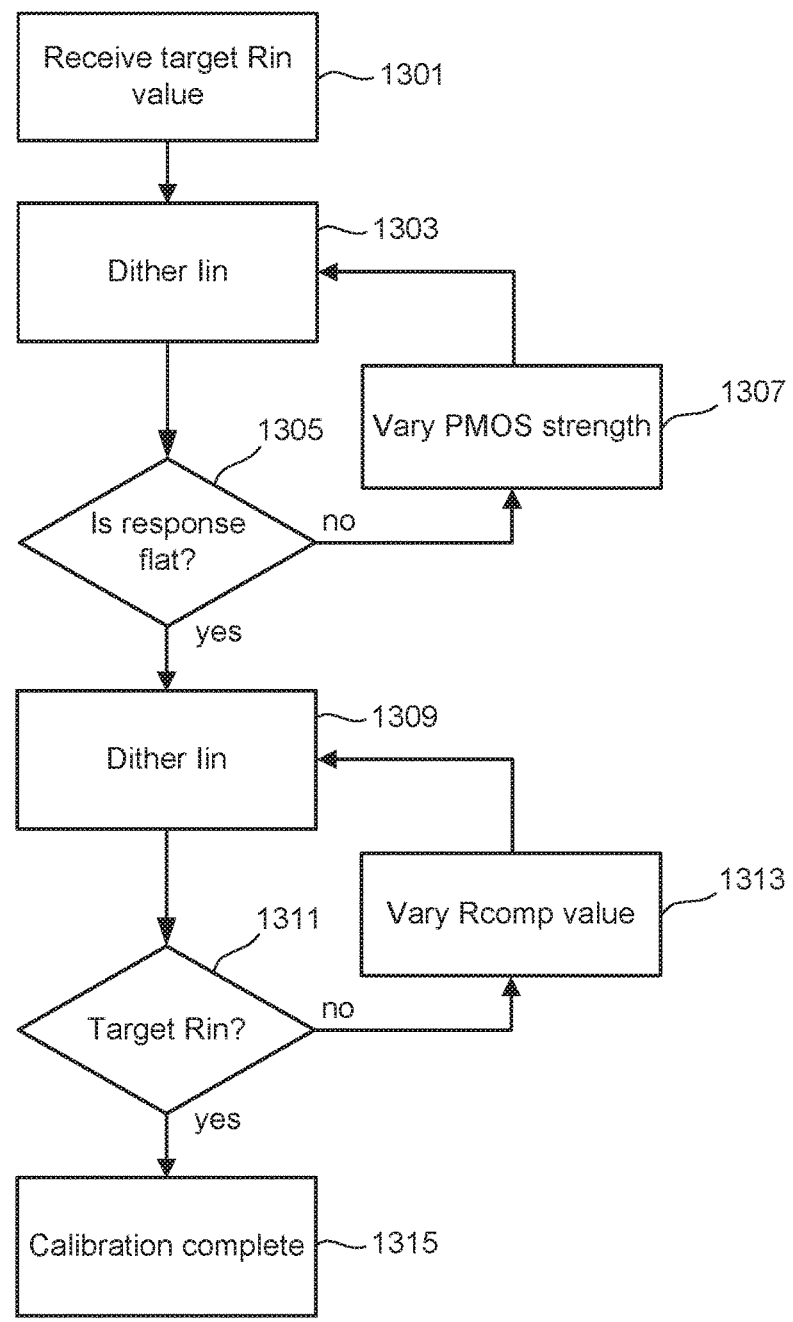
FIG. 13 is flowchart describing one embodiment of a process for the calibration of the active termination circuit of FIG. 7.

FIG. 13 is flowchart describing one embodiment of a process for a calibration process for trimming of the active termination circuit of FIG. 7. The calibration of the active termination circuit of FIG. 10 can be done similarly. In the flow of FIG. 13, the PMOS T2 703 is first calibrated, followed by calibrating Rcomp 717. In other embodiments, the effective width of NMOS T1 701 can also be calibrated, as discussed further below. In the flow of FIG. 13, the parameters for the NMOS T1 701 result from the process forming the circuit of FIG. 7. The flow of FIG. 13 begins at step 1301 with the parameters for T1 701 set by processing and receiving a target Rin value.

Steps 1303, 1305, and 1307 match the strength of PMOS T3 711 to the NMOS T1 701. At step 1303, the Iin value is dithered to determine the behavior of Rin for the different Iin values. At step 1305, it is determined if the Rin response is flat across Iin values. If not, the flow goes to step 1307 to vary the strength of PMOS T2 703. The strength of T2 703 can be varied by switching in and out the devices 703a, 703b, 703c, . . . of FIG. 12. After step 1307 the flow loops back to step 1303 to dither Iin for the current configuration of T2 703 and the Rin response is again checked.

Figure 14:
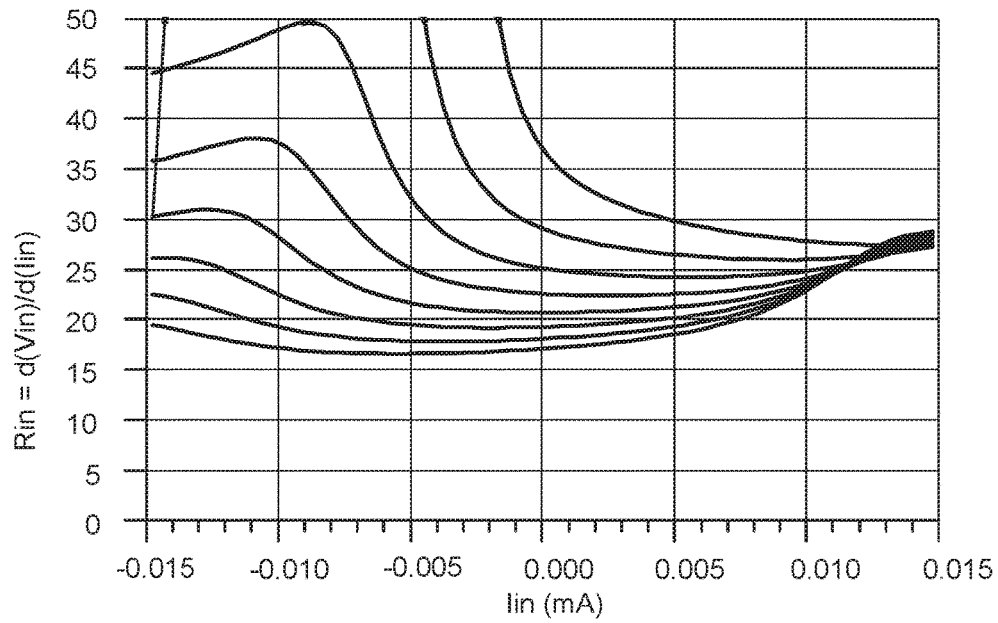
FIGS. 14 and 15 consider the variation of the operation of the active termination circuit of FIG. 7 in response to varying elements of the circuit.

The process of steps 1303, 1305, and 1307 can be illustrated by referring to FIG. 14, which illustrates the Iin versus Rin behavior of the active termination circuit of FIG. 7 for different PMOS strengths. The different lines of FIG. 14 can correspond to switching the different devices 703a, 703b, 703c, . . . of FIG. 12 in and out. The different strengths of T1 703 show different amounts of flatness across the Iin values. As discussed above with respect to FIG. 11, in an application to digital signals, it is flatness in the region around Iin=0, corresponding to logic transitions, that is most important. For the value ranges in FIG. 11, this means that the configuration of the 703a, 703b, 703c, . . . providing the flattest curve between −0.005 mV and 0.005 mA, where the behavior outside of this range (corresponding the high and low logic states) is of lesser importance.

Once the Rin response is suitably flat at step 1305, the flow goes to steps 1309, 1311 and 1313 to calibrate the value of Rcomp 717 to set Rin to the desired level, as specified at step 1301. For example, Rcomp 717 can be formed of a string of resistors whose value can be varied by where the string is tapped for connection to T4 713 or for connection to ground. At step 1309, the value of Iin is dithered to determine the Rin value across the relevant Iin range. At step 1311 it is determined whether the Rin is set to the desired value and, if so, the calibration process stops at step 1315 and the device is calibrated. If the value of Rin is off at step 1311, the flow goes to step 1313 to reconfigure Rcomp 717 and then back to step 1311 dither Iin to see if the reconfigured Rcomp 717 provides the desired Rin value.

Figure 15:
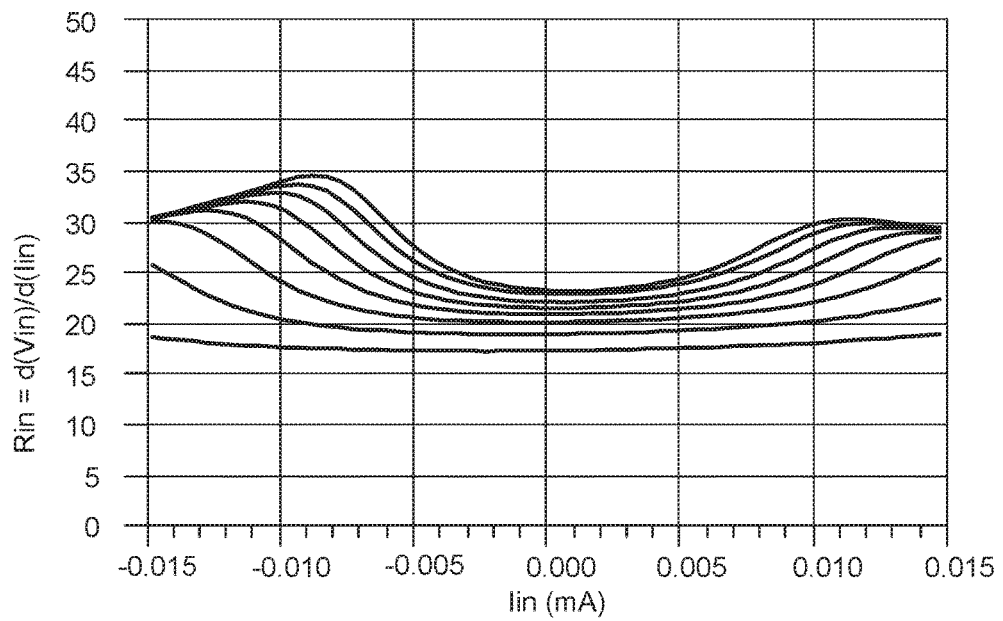

The process of steps 1309, 1311, and 1313 can be illustrated by referring to FIG. 15, which illustrates the Iin versus Rin behavior of the active termination circuit of FIG. 7 for different Rcomp 717 values. In FIG. 15, the different Rin curves correspond to different values of Rcomp 717 for the same strength of PMOS T2 703, previously determined in steps 1303, 1305, and 1307. By adjusting the value of Rcomp 717 up and down, the Rin curve is moved up and down. As this can also affect the shape of the curve, if setting of Rcomp 717 introduces too much variation across the Iin range of interest, it may be useful to perform another iteration of matching the strength of PMOS T2 703.

Other calibration techniques can also be used for the active low-power termination circuit. For example, as illustrated in FIGS. 8C and 8A respectively, the high logic response will mainly depend on T2 703 and the low logic response will mainly depend on T1 701. In one alternate calibration process, the impedance for a logic high can be programmed by varying the effective width of PMOS T2 703. The impedance for a logic low can then be programmed by programming the effective width of NMOS T1 701. Once the effective width of NMOS T1 701 (Wn) and the effective width of PMOS T2 703 (Wp) are determined, the impedance of the termination circuit can be varied by scaling T1 701 and T2 703 together while maintaining the ratio Wn/Wp.

Considering the above description, one embodiment includes a semiconductor device comprising a termination circuit having a first leg, a second leg, and a difference amplifier. The first leg includes an input node, a first transistor connected between a high voltage supply level and the input node, and a second transistor connected between the input node and a low voltage supply level. The second leg includes an intermediate node, a third transistor, a fourth transistor, and a variable current source. The third transistor is connected between the high voltage supply level and the intermediate node, the third transistor being diode connected and having a gate connected to a gate of the first transistor. The fourth transistor is connected between the intermediate node and the low voltage supply level, the fourth transistor being diode connected and having a gate connected to a gate of the second transistor. The variable current source is connected in series with the third and fourth transistor between the high voltage supply level and the low voltage supply level. The difference amplifier has a first input connected to the intermediate node, a second input connected to a reference level intermediate to the high voltage supply level and low voltage supply level, and an output configured to control the current level through the variable current source based on the voltage levels on the first input and the second input.

One embodiment includes a system of a first integrated circuit, a second integrated circuit, an interconnect configured to transmit signals between the first integrated circuit and the second integrated, and an active termination circuit connected to the interconnect. The active termination circuit includes a push-pull circuit having a node connected to the interconnect and a feed forward circuit connected to the push-pull circuit, the feed forward circuit configured to bias the push-pull circuit to set the node connected to the interconnect to a reference voltage level.

One embodiment includes a memory package comprising a plurality of non-volatile memory circuits, a package board on which the plurality of memory circuits are mounted, and a bus structure connecting the non-volatile memory circuits. An active termination circuit having a first leg and a second leg is formed on one of the non-volatile memory circuits and connected to the bus structure. The first leg includes a first transistor and a second transistor connected in series between a high voltage supply level and ground, the bus structure connected to a node between the first and second transistors. The second leg includes a third transistor and a fourth transistor connected in series between the high supply level and ground, and including a difference amplifier configured to maintain a node between the third and fourth transistors at a reference voltage intermediate to the high voltage level and ground, the second leg connected to first leg and configured to bias the first transistor and the second transistor based on bias conditions on the third transistor and the fourth transistor.

One embodiment includes an integrated circuit having a bond pad for the connection of a signal transmission line and an active termination circuit connected to the bond pad. The active termination circuit connected to the bond pad includes a push-pull circuit connected between a high voltage supply level and a low voltage supply level, including a node connected to the bond pad, and means for biasing the push-pull circuit to maintain the node at a reference voltage level intermediate to the high voltage supply level and the low supply level independently of a voltage level applied at the bond pad.

In some embodiments integrated circuit can be a non-volatile memory circuit or a memory controller. Embodiments of the push-pull circuit can include the transistors T1 701 and T2 703 of FIG. 7, or transistors T1 801, T2 803, T5 841, T6 843 of FIG. 10. The means for biasing the push-pull circuit can include a feed forward circuit configured to bias the elements of the push-pull circuit based on a reference level. One embodiment is illustrated in FIG. 7 and includes the transistors T3 711, T4 713, the difference amplifier 719 that has an input connected to the reference voltage Vref and the variable current source 715 that is controlled by the output of the difference amplifier 719. Another embodiment of the means for biasing the push-pull circuit can include the transistors T3 811, T4 813, the difference amplifier 819 and the variable current source 815.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension. An embodiment of the present technology will now be explained with reference to the following figures.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A semiconductor device comprising:
    a first termination circuit, comprising:
        a first leg including:
            an input node;
            a first transistor connected between a high voltage supply level and the input node; and
            a second transistor connected between the input node and a low voltage supply level;
        a second leg including:
            an intermediate node;
            a third transistor connected between the high voltage supply level and the intermediate node, the third transistor being diode connected and having a gate connected to a gate of the first transistor;
            a fourth transistor connected between the intermediate node and the low voltage supply level, the fourth transistor being diode connected and having a gate connected to a gate of the second transistor; and
            a variable current source connected in series with the third and fourth transistor between the high voltage supply level and the low voltage supply level; and
        a difference amplifier having a first input connected to the intermediate node, a second input connected to a reference level intermediate to the high voltage supply level and low voltage supply level, and an output configured to control a current level through the variable current source based on the first input and the second input.

2. The semiconductor device of claim 1, the first leg further including:
    a fifth transistor through which the first transistor is connected to the high voltage supply level, the fifth transistor being diode connected; and
    a sixth transistor through which the second transistor is connected to the low voltage supply level, the sixth transistor being diode connected.

3. The semiconductor device of claim 2, the first termination circuit further comprising:
    a seventh transistor having a gate connected to a gate of the fifth transistor; and
    an eighth transistor having a gate connected to a gate of the sixth transistor, the seventh transistor and the eighth transistor connected in series between the high voltage supply level and the low voltage supply level and configured to supply an internal logic level voltage from a node between the seventh transistor and the eighth transistor.

4. The semiconductor device of claim 3, the first termination circuit further comprising:
    a first current source connected to the gate of the fifth transistor; and
    a second current source connected to the gate of the sixth transistor.

5. The semiconductor device of claim 1, wherein a strength of the first transistor, a strength of the second transistor, or the strengths of both of the first transistor and the second transistor is configurable.

6. The semiconductor device of claim 5, wherein the second transistor comprises a plurality of devices selectively connectable in parallel between the input node and the low voltage supply level.

7. The semiconductor device of claim 1, the second leg further including:
    a resistor through which the fourth transistor is connected to the low voltage supply level.

8. The semiconductor device of claim 7, wherein a resistance value of the resistor is configurable.

9. The semiconductor device of claim 1, wherein the first and third transistors are NMOS devices and the second and fourth transistors are PMOS devices.

10. The semiconductor device of claim 1, wherein the variable current source is connected between the third transistor and the high voltages supply level.

11. The semiconductor device of claim 1, wherein the semiconductor device is a memory circuit comprising:
    a first bond pad configured to exchange electrical signals with a first bond wire connected thereto, the input node of the first termination circuit connected to the first bond pad.

12. The semiconductor device of claim 11, further comprising:
    a second bond pad configured to exchange electrical signals with a second bond wire connected thereto; and
    a second termination circuit, including:
        a node connected to the second bond pad;
        a fifth transistor connected between the high voltage supply level and the node connected to the second bond pad, a gate of the fifth transistor connected to the gate of the third transistor; and
        a sixth transistor connected between the node connected to the second bond pad and ground, a gate of the sixth transistor connected to the gate of the fourth transistor.

13. A memory package, comprising:
    a plurality of non-volatile memory circuits;
    a package board on which the plurality of non-volatile memory circuits are mounted;
    a bus structure connecting the non-volatile memory circuits; and
    an active termination circuit formed on one of the non-volatile memory circuits and connected to the bus structure, the active termination circuit comprising:
        a first leg including a first transistor and a second transistor connected in series between a high voltage supply level and ground, the bus structure connected to a node between the first and second transistors; and a second leg including a third transistor and a fourth transistor connected in series between the high voltage supply level and ground, and including a difference amplifier configured to maintain a node between the third and fourth transistors at a reference voltage intermediate to the high voltage supply level and ground, the second leg connected to first leg and configured to bias the first transistor and the second transistor based on bias conditions on the third transistor and the fourth transistor.

14. The memory package of claim 13, further comprising:
a controller mounted on the package board and connected to the bus structure.

15. The memory package of claim 13, wherein the memory package is configured to be mounted on a printed circuit board including a controller and the bus structure configured to be connected to the controller.

16. A system, comprising:
a first integrated circuit;
a second integrated circuit;
an interconnect configured to transmit signals between the first integrated circuit and the second integrated circuit; and
an active termination circuit formed on one of either the first integrated circuit and the second integrated circuit and connected to the interconnect, the active termination circuit comprising:
a first leg including a first transistor and a second transistor connected in series between a high voltage supply level and ground, the interconnect connected to a node between the first and second transistors; and
a second leg including a third transistor and a fourth transistor connected in series between the high voltage supply level and ground, and including a difference amplifier configured to maintain a node between the third and fourth transistors at a reference voltage intermediate to the high voltage supply level and ground, the second leg connected to first leg and configured to bias the first transistor and the second transistor based on bias conditions on the third transistor and the fourth transistor.

17. The system of claim 16, wherein the first integrated circuit and the second integrated circuit are mounted on a printed circuit board.

18. The system of claim 16, wherein the first integrated circuit is a non-volatile memory circuit and the second integrated circuit is a non-volatile memory controller circuit.

19. The system of claim 18, wherein the system is part of a memory card.

20. The system of claim 18, wherein the system is part of a solid state drive (SSD).

* * * * *